United States Patent
Hwang et al.

(10) Patent No.: US 6,234,374 B1
(45) Date of Patent: May 22, 2001

(54) RAPID AND SELECTIVE HEATING METHOD IN INTEGRATED CIRCUIT PACKAGE ASSEMBLY BY MEANS OF TUNGSTEN HALOGEN LIGHT SOURCE

(75) Inventors: Ming Hwang, Richardson; Gonzalo Amador, Dallas, both of TX (US); Lobo Wang, Taipei (TW)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/435,993

(22) Filed: Nov. 8, 1999

Related U.S. Application Data

(62) Division of application No. 08/255,197, filed on Jun. 7, 1994, now abandoned.

(51) Int. Cl.$^7$ .............................. B23K 31/02; H05B 3/12
(52) U.S. Cl. ..................... 228/102; 228/4.5; 228/180.5; 228/234.1; 219/220
(58) Field of Search ................... 228/4.5, 180.5, 228/234.1, 110.1, 111.5, 112.1; 219/56.01, 121.66, 129, 553, 220; 156/359, 379.6, 379.8, 380.9, 382, 497, 498, 85.12; 250/505.1

(56) References Cited

U.S. PATENT DOCUMENTS

| | | | |
|---|---|---|---|
| 3,632,324 | * 1/1972 | Sasaki et al. ............................. | 65/43 |
| 3,650,454 | * 3/1972 | Coucoulas ................................ | 228/1 |
| 4,030,603 | * 6/1977 | Angell .................................... | 206/521 |
| 4,278,867 | * 7/1981 | Tan ................................ | 219/121 LD |
| 4,671,446 | * 6/1987 | Sherman ............................... | 228/4.5 |
| 4,685,200 | * 8/1987 | Bokil ................................... | 437/215 |
| 4,701,772 | * 10/1987 | Anderson et al. .................... | 346/160 |
| 4,855,102 | * 8/1989 | Okada et al. ............................ | 419/8 |
| 5,049,718 | * 9/1991 | Spletter et al. .................. | 219/121.64 |
| 5,302,230 | * 4/1994 | Ino et al. ............................. | 156/603 |
| 5,305,944 | * 4/1994 | Yoshida et al. ................. | 228/180.22 |
| 5,626,280 | * 5/1997 | Ciambrone ..................... | 228/180.21 |
| 5,648,005 | * 7/1997 | Cobb et al. .......................... | 219/411 |
| 5,783,025 | * 7/1998 | Hwang et al. ...................... | 156/359 |
| 5,846,476 | * 12/1998 | Hwang et al. ...................... | 264/493 |
| 5,993,591 | * 11/1999 | Buendia ............................ | 156/275.5 |
| 6,041,994 | * 3/2000 | Hwang et al. ....................... | 228/4.5 |

FOREIGN PATENT DOCUMENTS

| | | |
|---|---|---|
| 3560566659A | * 5/1981 | (JP) . |
| 410189643A | * 7/1998 | (JP) . |

* cited by examiner

*Primary Examiner*—Patrick Ryan
*Assistant Examiner*—Kiley Stoner
(74) *Attorney, Agent, or Firm*—Wade James Brady, III; Frederick J. Telecky, Jr.

(57) ABSTRACT

A method and apparatus for selectively heating a structure capable of absorbing heat radiations in the 0.5 to 2 micron range relative to an adjacent structure wherein a first structure capable of absorbing heat radiations in the 0.5 to 2 micron range is disposed adjacent a second structure much less capable of absorbing heat radiations in the 0.5 to 2 micron range. An unfocused heat source which provides a major portion of its heat energy in the range of from about $0.5\mu$ to about $2\mu$ relative to heat energy above $2\mu$ and below 0.5 micron directs heat concurrently to the first and second structures to heat the first structure to a temperature sufficiently high and much higher then the second structure to permit a predetermined function to be performed in conjunction with the first structure while maintaining the second structure below a predetermined temperature. The function is then performed. The heat source preferably comprises an unfocused tungsten halogen lamp.

14 Claims, 1 Drawing Sheet

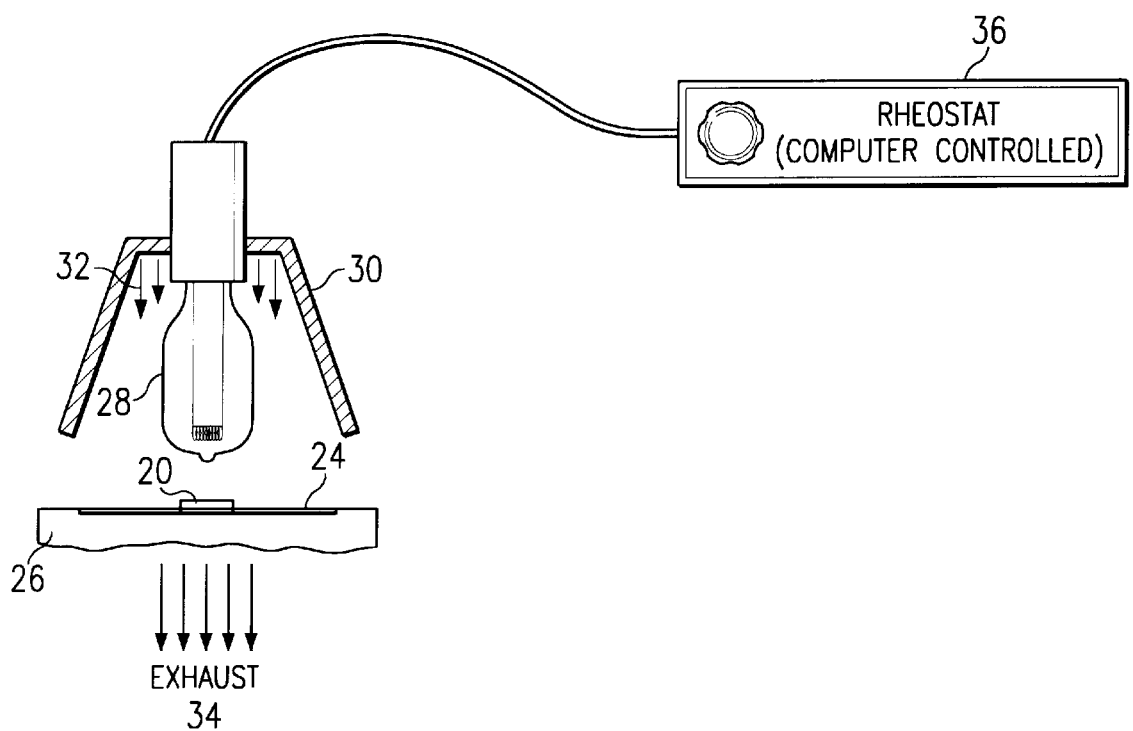

RAPID AND SELECTIVE HEATING METHOD IN INTEGRATED CIRCUIT PACKAGE ASSEMBLY BY MEANS OF TUNGSTEN HALOGEN LIGHT SOURCE

CROSS REFERENCE TO RELATED APPLICATIONS

This application is a division of Ser. No. 08/255,197, filed Jun. 7, 1994 now abandoned and the applications and prior art cited therein which are all incorporated herein by reference.

BACKGROUND OF THE INVENTION

1. Field of the Invention

This invention relates to a system for rapidly heating selected portions of an integrated circuit package assembly and, more specifically, to such heating using a heat source capable of selectively heating a predetermined portion of an area while the entire area is being subjected to heat-generating radiations from the heat source, the heat source preferably being a tungsten halogen light source.

2. Brief Description of the Prior Art

In the fabrication of semiconductor devices and particularly integrated circuits, it is desirable that the semiconductor chip be heated to temperatures in the range of about 200 to 300° C. prior to wire bonding in order to improve the bonding process. It is also desirable that the lead frame to which a bond is to be made be retained at a much lower temperature than the chip, this lower temperature being sufficiently low to minimize oxidation of the lead frame material, generally copper. Lead frame oxidation generally diminishes the wet solderability thereof, leading to the obvious problems resulting therefrom. This problem has existed in the prior art because the mechanism used for heating of the semiconductor chip, generally a heater block or hot plate, also supports the lead frame and is non-heat selective. Accordingly, both the chip and the lead frame are heated together as a single unit to about the same high temperature, this being the temperature required for bonding to the chip. It is therefore apparent that a system whereby the semiconductor chip can be selectively heated relative to the lead frame while the chip and lead frame are in contact with each other is highly desirable.

A proposed lid sealing apparatus and method by Bokil would replace a metal heater filament with a beam of focused infrared light to reduce heat transfer into the ceramic package. See U.S. Pat. No. 4,481,708 issued Nov. 13, 1984 and U.S. Pat. No. 4,685,200 issued Aug. 11, 1987 OF D. R. Bokil and D. R. Bokil et al., and, the article by D. E. Erickson "Hybrid Circuit Sealing-Problem Prevention Clinic", Electronic Packaging and Production, 22(11): pp. 133–137, November 1982. The Bokil system is relatively large and complicated due to the spacing design required to focus the infrared beams towards the glass for the lid seal and the required number of infrared beams (one on each side of the package).

SUMMARY OF THE INVENTION

In accordance with the present invention, the above described problems of the prior art are minimized and there is provided an apparatus and procedure for sending defocused or unfocused heat-inducing radiations over a general area wherein certain components within the area are selectively heated at a much greater rate than the remainder of the area. The use of unfocused heat-inducing radiations eliminates the need for the focussing equipment and permits the radiations to traverse a general area without requirement for accurate positioning since the nature of the materials receiving the radiations will determine the degree of heating thereof. For example, a semiconductor chip will heat up much more rapidly than will a copper-based or aluminum-based lead frame prior to wire bonding, thereby permitting wire bonding between the chip and the lead frame without excessively heating up the lead frame. The same type of operation is available when the lead frame is replaced by a tape with conductors thereon for standard tape automated bonding (TAB) wherein it is best to heat up the metal lead portions on the tape adjacent the chip and the chip to the exclusion of the tape itself since the tape degrades at the normal wire bonding temperatures and affects the electrical properties of the tape. The tape can be between the chip and a circuit board. Reflow soldering for a solder grid array in a ceramic package to secure a semiconductor chip to a circuit board is provided in the same manner with the ceramic heating the solder to its melting temperature before the semiconductor device is heated to an unsafe temperature. Rework of a printed circuit board is provided wherein a single component must be replaced without heating the entire board and components thereon by directing the radiations only over the general area containing the component to be removed to the exclusion of the remainder of the board and heating until the component can be removed by heating of the epoxy, polyimid or the like securing the component to the board or by melting solder holding the component to the board. The component can be a package containing a chip, the chip itself which is secured directly to the board or other types of components. In the case of molded ceramic or plastic packages, it is often difficult to place symbols on the package surface due to the presence of mold release agents. These mold release agents are removed from the package surface pyrolitically by heating the mold release agent on the surface of the package to the exclusion of the remainder of the package.

It has been determined that certain materials, such as, for example, the chip will heat up at a much greater rate than will other materials, such as, for example, the lead frame material when the heat source is providing unfocused energy radiations in the range of from about $0.5\mu$ to about $2.0\mu$. This is because the lead frame material, generally copper, heats up rapidly when the heat energy radiations are above $2\mu$ but heats slowly when the heat energy is in the range of from about $0.5\mu$ to about $2\mu$ whereas the chip material, generally silicon, germanium or a group III–V or group II–VI compound, heats up rapidly when the heat energy is in the range of from about $0.5\mu$ to about $2\mu$. It follows that a heat source which supplies at least a substantial part of its heat energy in the range of from about $0.5\mu$ to about $2\mu$ will selectively heat the semiconductor material relative to the lead frame. The amount of the energy in the range of from about $0.5\mu$ to about $2\mu$ required will be dependent upon the heat temperature differential required as well as the rate at which this temperature differential is achieved. Accordingly, a heat source which provides a substantial portion of its heat energy in the range of from about $0.5\mu$ to about $2\mu$ is required in accordance with the present invention. The standard tungsten halogen light source generally provides a substantial portion of its heat energy in the range of from about $0.5\mu$ to about $2\mu$.

Briefly, the above is accomplished with regard to a lead frame and chip by providing a base and disposing both a lead frame and a chip thereon in standard relation to each other. A heat source of the type described above, preferably with a reflector to direct most of the radiations to a desired area, then directs the heat to the lead frame and chip. The chip will heat up to the required bonding temperature and bonding thereto then takes place while the lead frame meanwhile remains at a temperature lower than that of the chip and sufficiently low to avoid excessive oxidation thereof. The heat source is then turned off after bonding takes place.

With reference to reflow soldering for a solder grid array (SGA) ceramic package, the ceramic material, such as aluminum nitride, will rise in temperature quickly and transfer heat to the solder balls before the temperature of the semiconductor chip has risen sufficiently to affect its properties. Even when no chip is present, the soldering takes place more rapidly since the heating is directed to the locations where the heat is required to the exclusion of other locations.

BRIEF DESCRIPTION OF THE DRAWING

The FIGURE conceptually illustrates a heating system for a semiconductor die and associated lead frame in accordance with the present invention.

DESCRIPTION OF THE PREFERRED EMBODIMENT

The FIGURE is a drawing conceptually illustrating an inventive optical heating system and method for use in conjunction with bonding of a wire between a pad on a semiconductor chip and a lead frame. In the FIGURE, a silicon semiconductor die 20 rests on a chip pad 26 along with a lead frame 24. Examples of lead frame materials include copper, alloy 42, palladium/copper, and nickel copper. An optical heat source 28, a typical such source being described in the above noted application, can be used herein and that heat source is incorporated herein by reference. Optical heat source 28 generates substantial radiations in the 0.5 to 2 micron range, this energy being used to heat the lead frame 24 and the die 20. For copper based lead frames and normal die size, this heating system is particularly advantageous as the lead frame 24 remains much cooler than die 20 during die heating. As an example, a 1 minute exposure to optical heat source 28 may result in die 20 being heated to about 200° C. while lead frame 24 is heated to only about 125° C. As such, optical heat source 28 selectively heats die 20. Principal heat transfer occurs by radiation and the temperature response of the die is advantageously a smooth transient. Temperature profiles can be readily controlled during cure by varying the current through the lamp 28. In the prior art heater block method, however, heat transfer is through conduction which results in a step function like temperature response. Resident heat in the heater block precludes rapid cooling, thereby causing further oxidation of the lead frame material. Rapid optical heating allows rapid thermal response.

Optical heat source 28 is preferably a lamp of the type that emits near infrared light. Exemplary lamp examples include incandescent halogen lamps of the tungsten type and xenon type. Infrared light wavelengths range from just about 0.5 microns to about 2.0 microns. Silicon chip 20 has good absorption in the near infrared spectrum. The energy of the tungsten halogen light, for example, is absorbed more by silicon chip 20 than by lead frame 24 which has a higher incidence of reflection than chip 20. The silicon chip 20 is heated by radiation to a higher temperature than lead frame 24 due to selective heating. Wire bonding then takes place while the chip is heated relative to the lead frame.

A reflector 30 helps direct unfocused emissions from lamp 28 toward lead frame 24. Preferably the emissions are directed over the width of the lead frame so that uniform heating occurs. The light is spread over the lead frame area as opposed to being focused on the semiconductor chip. Optionally, dry air 32 can flow over the die 20, through lead finger cutouts (unillustrated) in lead frame 24 and out exhaust outlet 34. No obstruction exists beneath lead frame 24 to block air flow. Purge air 32 is able to flow over die 20 and through lead frame 24 more closely to the edge of die 20 substantially increasing the evacuation of outgassing effects and the like. The intensity (power) of lamp 28 may be controlled by a rheostat 36 or SCR which in turn may be computer controlled, the computer being optionally program controlled. This advantageously allows lamp power to be profiled or turned on and off with immediate energy response in contrast to the heater block of prior art which is effectively unprofileable during snap cure because of its thermal mass. Instant lamp power adjustment aids in energy profiling.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method for selectively heating a semiconductor die selective to a lead during a wire bonding procedure comprising the steps of:
    (a) disposing a semiconductor die adjacent a lead frame;
    (b) providing heat from a heat source having a major portion of its heat energy in the wavelength range of from about $0.5\mu$ to about $2\mu$ relative to heat energy provided by said heat source above the wavelength range above $2\mu$ and below 0.5 microns;
    (c) directing said heat concurrently to said semiconductor die and said lead frame to heat said semiconductor die to a temperature sufficiently high for wire bonding while maintaining said lead frame in a substantially non-oxidizing state; and
    (d) bonding a wire to said heated die.
2. The method of claim 1 wherein the heat source is an optical heat source having an unfocused lamp.
3. The method of claim 1 further including the step of controlling the heat generated by said heat source.
4. The method of claim 2 further including the step of controlling the heat generated by said heat source.
5. The method of claim 1 further comprising the step of controlling the heat generated by said heat source with a computer.
6. The method of claim 2 further comprising the step of controlling the heat generated by said heat source with a computer.
7. The method of claim 5 wherein the control by said computer is a programmed control.
8. The method of claim 6 wherein the control by said computer is a programmed control.
9. A method for selectively heating a structure capable of absorbing heat radiations in the 0.5 to 2 micron wavelength range relative to an adjacent structure much less capable of absorbing heat radiations in the 0.5 to 2 micron range comprising the steps of:
    (a) providing a first structure capable of absorbing heat radiations in the 0.5 to 2 micron wavelength range disposed adjacent a second structure much less capable than said first structure of absorbing heat radiations in the 0.5 to 2 micron wavelength range;

(b) providing a heat source which provides a major portion of its heat energy in the wavelength range of from about $0.5\mu$ to about $2\mu$ relative to heat energy provided by said heat source above a wavelength of $2\mu$ and below a wavelength of 0.5 micron for directing said heat concurrently to said first and second structures to heat said first structure to a temperature sufficiently high to permit a predetermined operation to be performed in conjunction with said first structure while maintaining said second structure below a predetermined temperature much lower than said first structure; and (c) performing said operation.

10. The method of claim 9 wherein the heat source is an optical heat source having an unfocused lamp.

11. The method of claim 9 further including the step of controlling heat generated by said heat source.

12. The method of claim 10 further including the step of controlling heat generated by said heat source.

13. The method of claim 9 further comprising the step of providing a computer to control said heat source.

14. The method of claim 10 further comprising the step of providing a computer to control said heat source.

\* \* \* \* \*